United States Patent
Park et al.

(10) Patent No.: US 7,241,652 B2
(45) Date of Patent: Jul. 10, 2007

(54) METHOD FOR FABRICATING ORGANIC THIN FILM TRANSISTOR

(75) Inventors: Hyun Jung Park, Seoul (KR); Bon Won Koo, Gyeonggi-do (KR); Joo Young Kim, Gyeonggi-do (KR); Jung Han Shin, Gyeonggi-do (KR); Eun Jeong Jeong, Gyeonggi-do (KR); Sang Yoon Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 111 days.

(21) Appl. No.: 11/123,120

(22) Filed: May 6, 2005

(65) Prior Publication Data

US 2006/0128083 A1    Jun. 15, 2006

(30) Foreign Application Priority Data

Dec. 9, 2004    (KR) .................... 10-2004-0103537

(51) Int. Cl.
*H01L 21/336* (2006.01)
*H01L 21/8234* (2006.01)

(52) U.S. Cl. .................. 438/197; 438/725; 257/E21; 257/51; 257/E51; 257/6

(58) Field of Classification Search .............. 438/197, 438/99, 142, 149, 502, 680, 725, 789, 793, 438/794
See application file for complete search history.

(56) References Cited

U.S. PATENT DOCUMENTS

| | | | | |
|---|---|---|---|---|
| 5,347,144 A | * | 9/1994 | Garnier et al. ................ | 257/40 |
| 5,796,121 A | * | 8/1998 | Gates ........................... | 257/59 |
| 6,326,640 B1 | * | 12/2001 | Shi et al. ...................... | 257/40 |
| 6,433,359 B1 | * | 8/2002 | Kelley et al. ................. | 257/40 |
| 6,621,098 B1 | * | 9/2003 | Jackson et al. ............... | 257/40 |
| 6,870,181 B2 | * | 3/2005 | Zhang et al. ................. | 257/40 |

* cited by examiner

*Primary Examiner*—David Nhu
(74) *Attorney, Agent, or Firm*—Buchanan Ingersoll & Rooney PC

(57) ABSTRACT

Disclosed herein is a method for fabricating an organic thin film transistor that includes a gate electrode, a gate insulating film, source/drain electrodes and an organic semiconductor layer formed in this order on a substrate wherein the surface of the gate insulating film on which source/drain electrodes are formed is impregnated with an inorganic or organic acid, followed by annealing. According to the method, the surface of a gate insulating film damaged by a photoresist process can be effectively recovered. In addition, organic thin film transistors having high charge carrier mobility and high on/off current ratio can be fabricated.

17 Claims, 1 Drawing Sheet

US 7,241,652 B2

METHOD FOR FABRICATING ORGANIC THIN FILM TRANSISTOR

BACKGROUND OF THE INVENTION

Priority is claimed under 35 U.S.C. § 119(a) to Korean Patent Application No. 2004-103537 filed on Dec. 9, 2004, which is herein incorporated by reference.

1. Field of the Invention

The present invention relates to a method for fabricating an organic thin film transistor, and more particularly to a method for fabricating an organic thin film transistor comprising a gate electrode, a gate insulating film, source/drain electrodes and an organic semiconductor layer formed in this order on a substrate wherein the surface of the gate insulating film on which source/drain electrodes are formed is impregnated with an inorganic or organic acid, followed by annealing.

2. Descriotion of the Related Art

Since polyacetylenes as conjugated organic polymers exhibiting semiconductor characteristics were developed, organic semiconductors have been actively investigated as novel electrical and electronic materials in a wide variety of applications, e.g., functional electronic and optical devices, in terms of various manufacturing processes, easy molding into fibers and films, superior flexibility, high conductivity and low manufacturing costs.

Among devices fabricated by using these electrically conductive polymers, research on organic thin film transistors fabricated using organic materials as active layers has been conducted since 1980. In this connection, a number of studies are now being actively undertaken around the world. Organic thin film transistors are substantially identical to silicon (Si) thin film transistors in terms of their structure, but have a difference in that organic materials are used as materials for semiconductor regions instead of silicon (Si). In addition, such organic thin film transistors have the advantages that they can be fabricated by using printing processes at ambient pressure, instead of conventional silicon processes, such as plasma-enhanced chemical vapor deposition (CVD).

Organic thin film transistors are expected to be useful for driving devices of active displays and plastic chips for use in smart cards and inventory tags, and are comparable to α-Si thin film transistors in terms of their performance.

On the other hand, general organic thin film transistors (OTFTs) comprise a substrate, a gate electrode, a gate insulating film, source/drain electrodes, and an organic semiconductor layer. Organic thin film transistors can be classified into bottom-contact OTFTs wherein an organic semiconductor layer is formed on source/drain electrodes, and top-contact OTFTs wherein source-drain electrodes are formed on an organic semiconductor layer by mask deposition.

The fabrication of bottom-contact OTFTs involves a photoresist process for forming a pattern after deposition in order to form source-drain electrodes on a gate insulating film. At this time, the gate insulating film is exposed to a photoresist stripper and nitrogen generated from the stripper is adsorbed to the surface of the gate insulating film, leading to damage to the gate insulating film and thus making it impossible to fabricate OTFTs with superior insulating properties.

There have been introduced some attempts to reduce the damage to the surface of a gate insulating film. For example, damaged surface of a gate insulating film is physically treated using non-reactive gas plasma, or a gate insulating film is formed into a double layer by a self-assembly monolayer (SAM).

The aforementioned attempts simply smooth the damaged surface of the gate insulating film in a physical manner or necessitate an additional material for the formation of the double layer.

SUMMARY OF THE INVENTION

Therefore, the present invention has been made in view of the above problems of the prior art, and it is an object of the present invention to provide an improved method for fabricating an organic thin film transistor by treating the surface of a gate insulating film on which source/drain electrodes are formed with an acid, enabling damaged surface of the gate insulating film to be effectively recovered by the simple chemical process and allowing the organic thin film transistor to have superior electrical properties, particularly high charge carrier mobility and high on/off current ratio ($I_{on}/I_{off}$ ratio).

In accordance with one aspect of the present invention for achieving the above object, there is provided a method for fabricating an organic thin film transistor comprising a gate electrode, a gate insulating film, source/drain electrodes and an organic semiconductor layer formed in this order on a substrate wherein the surface of the gate insulating film on which source/drain electrodes are formed is impregnated with an inorganic or organic acid, followed by annealing.

In accordance with another aspect of the present invention, there is provided an organic thin film transistor fabricated by the method.

In accordance with yet another aspect of the present invention, there is provided a display device manufactured using the organic thin film transistor.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described in more detail with reference to the accompanying drawings.

Figure 1:
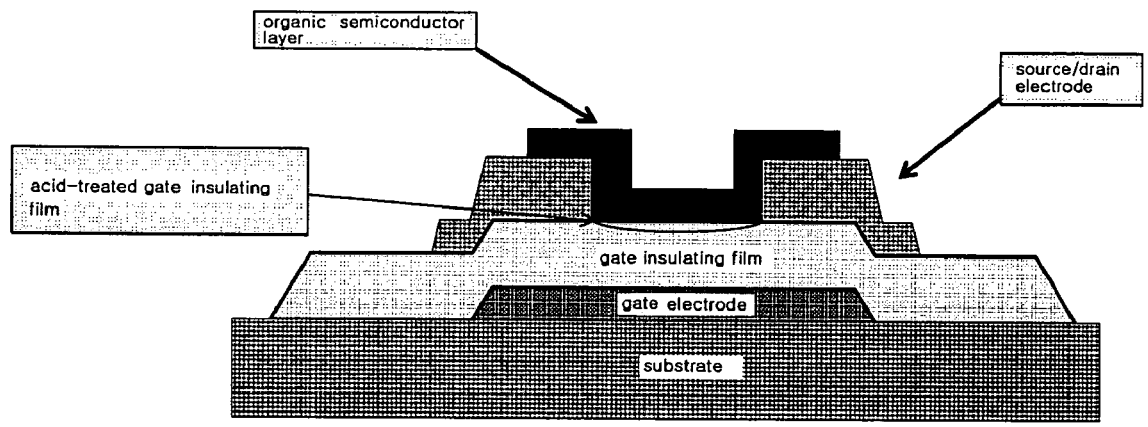
FIG. 1 is a cross-sectional view schematically showing the structure of an organic thin film transistor fabricated in one example of the present invention.

A method for fabricating an organic thin film transistor according to the present invention can be applied to bottom-contact structures. FIG. 1 is a cross-sectional view schematically showing the structure of an organic thin film transistor fabricated in one example of the present invention. Referring to FIG. 1, a gate electrode is formed on a substrate, a gate insulating film is formed thereon, source/drain electrodes are formed on the gate insulating film, and an organic semiconductor layer is formed thereon.

The method of the present invention is characterized in that the organic thin film transistor shown in FIG. 1 is fabricated by impregnating the surface of the gate insulating film on which the source/drain electrodes are formed with an inorganic or organic acid, followed by annealing.

That is, the method of the present invention comprises the steps of: i) forming a gate electrode on a substrate; ii) forming a gate insulating film thereon; iii) forming source/drain electrodes on the gate insulating film; iv) treating the gate insulating film with an acid; and v) forming an organic semiconductor layer thereon.

The method of the present invention will be explained based on the respective steps.

Step (i):

A substrate is washed to remove impurities in accordance with common processes, and a gate electrode is formed on the substrate by deposition or patterning.

Step (ii):

After formation of the gate electrode, a gate insulating film is formed thereon by, e.g., vacuum deposition or solution processing. For example, polyvinylphenol containing a crosslinking agent is coated to a thickness of 450 nm to 650 nm, and soft-baked at 60~150° C. for about 1 to 10 minutes.

Step (iii):

Source/drain electrodes are formed on the gate insulating film. For example, ITO is coated on the gate insulating film by a thermal evaporation method to form a thin film, and is then developed by exposing areas where a source electrode and a drain electrode are formed (and possibly areas other than the source and drain electrodes) to light through a mask. Thereafter, etching is carried out using acetonitrile, etc., and a photoresist is removed using a photoresist stripper to form source/drain electrodes on the gate insulating film.

A photoresist stripper used to remove the photoresist commonly contains 4~12% of tetraethylene glycol, 20~40% of tetrahydrothiophene, 30~50% of N-methylpyrrolidone (NMP) and 5~20% of diethylene glycol monoethyl ether. The photoresist striper may cause adsorption of nitrogen to the surface of the gate insulating film to make the gate insulating film weakly basic, leading to damage to the gate insulating film. In an exemplary method of the present invention, the weakly basic surface of the gate insulating film is treated with an inorganic or organic acid to neutralize it, enabling effective recovery of the damaged surface of the gate insulating film.

Step (iv):

After formation of the source/drain electrodes, the gate insulating film damaged by the photoresist stripper is impregnated with an inorganic or organic acid at 15~35° C. for 0.5~10 seconds. To improve the adhesion of the source electrode and the drain electrode, annealing is carried out by heat treatment at 90~200° C. for 1~10 minutes.

Specific examples of exemplary inorganic acids includes, but are not limited to, HI, HBr, HCl, HF, HNO$_3$, H$_3$PO$_4$, H$_2$SO$_4$, and mixtures thereof. As the mixed acids, there may be exemplified ITO etchants containing HCl and HNO$_3$.

An exemplary organic acid used in the method of the present invention is represented by Formula 1 below:

RCOOH                    Formula 1 wherein R is H; a C$_{1\sim12}$ alkyl, alkenyl or alkynyl group; a C$_{3\sim30}$ cycloalkyl group; a C$_{6\sim30}$ aryl group; or a fluoro-substituted functional group.

Step (v)

Finally, an organic semiconductor material (for example, pentacene) is coated thereon by thermal evaporation to form an organic semiconductor layer.

Examples of materials for the gate insulating film include, but are not limited to: organic materials, such as polyolefins, polyvinyls, polyacryls, polystyrenes, polyurethanes, polyimides, polyvinylphenols and derivatives thereof; and inorganic materials, such as SiN$_x$ (0<x<4), SiO$_2$ and Al$_2$O$_3$.

Examples of suitable materials for the organic semiconductor layer of the organic thin film transistor fabricated by the method of the present invention include, but are not limited to, pentacenes, copper phthalocyanines, polythiophenes, polyanilines, polyacetylenes, polypyrroles, polyphenylene vinylenes, and derivatives thereof.

Suitable materials for the gate electrode and the source/drain electrodes are metals and electrically conductive polymers commonly used in the art, and their specific examples include, but are not limited to, gold (Au), silver (Ag), aluminum (Al), nickel (Ni), molybdenum (Mo), tungsten (W), indium-tin oxides (ITO), polythiophenes, polyanilines, polyacetylenes, polypyrroles, polyphenylene vinylenes, and polyethylenedioxythiophene (PEDOT)/polystyrenesulfonate (PSS) mixtures.

The substrate can be made of, without limitation, glass, silicon, plastic, etc.

The organic thin film transistor fabricated by an exemplary method of the present invention can be utilized in the manufacture of display devices, such as electroluminescence devices, liquid crystal devices, and electrophoresis devices.

The present invention will now be described in more detail with reference to the following examples. However, these examples are given for the purpose of illustration and are not to be construed as limiting the scope of the invention.

EXAMPLE 1

First, Al was deposited on a washed glass substrate by a sputtering technique to form a gate electrode having a thickness of 1,500 Å. Polyvinylphenol containing a crosslinking agent was spin-coated thereon at 1,000 rpm to a thickness of 5,000 Å, and soft-baked at 100° C. for 5 minutes to form a gate insulating layer. Next, ITO was deposited on the insulating layer to a thickness of 1,000 Å by a thermal evaporation method, and was then subjected to photolithography to form an ITO electrode pattern. At this time, the evaporation was conducted under a vacuum pressure of 2×10$^{-7}$ torr, a substrate temperature of 50° C. and a deposition rate of 0.85 Å/sec. Then, the gate insulating film was impregnated with an ITO etchant at room temperature for 2 seconds, and was then annealed at 130° C. for 3 minutes. Pentacene was deposited thereon to a thickness of 1,000 Å under a vacuum of 2×10$^{-7}$ torr, a substrate temperature of 50° C. and a deposition rate of 0.85 Å/sec. by a thermal evaporation method to fabricate an organic thin film transistor.

EXAMPLE 2

An organic thin film transistor was fabricated in the same manner as in Example 1, except that Mo was used as a material for the source/drain electrodes.

EXAMPLE 3

An organic thin film transistor was fabricated in the same manner as in Example 1, except that Au was used as a material for the source/drain electrodes.

EXAMPLE 4

An organic thin film transistor was fabricated in the same manner as in Example 1, except that the surface of the gate insulating film was treated with HNO$_3$.

EXAMPLE 5

An organic thin film transistor was fabricated in the same manner as in Example 1, except that the surface of the gate insulating film was treated with HCl.

COMPARATIVE EXAMPLE 1

An organic thin film transistor was fabricated in the same manner as in Example 1, except that the surface of the gate insulating film was not treated with an acid.

COMPARATIVE EXAMPLE 2

An organic thin film transistor was fabricated in the same manner as in Example 2, except that the surface of the gate insulating film was not treated with an acid.

Figure 2:
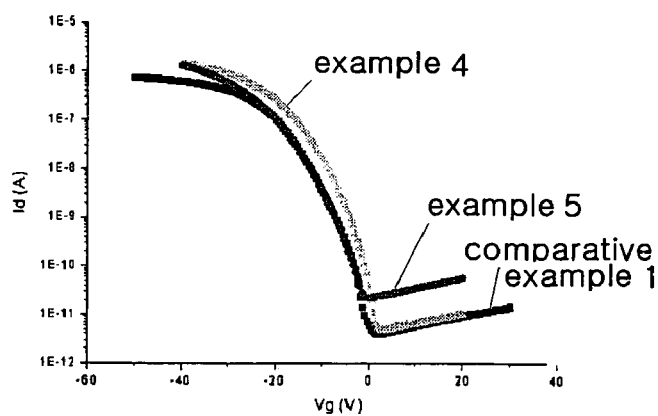
FIG. 2 is a graph showing the current transfer characteristics of organic thin film transistors fabricated in Examples 4 and 5 and Comparative Example 1 of the present invention.

The current transfer characteristics of the organic thin film transistors fabricated in Examples 4 and 5 and Comparative Example 1 were evaluated using a KEITHLEY semiconductor analyzer (4200-SCS), and the results are shown in FIG. 2.

The electrical properties of the organic thin film transistors fabricated in Examples 1 to 5 and Comparative Examples 1 and 2 were measured in accordance with the following procedure. The obtained results are shown in Table 1.

* Charge carrier mobility was calculated from the slope of a graph representing the relationship between $(I_{SD})^{1/2}$ and $V_G$ from the following current equations in the saturation region:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}$: source-drain current, $\mu$ and $\mu_{FET}$: charge carrier mobility, $C_o$: capacitance of the oxide film, W: channel width, L: channel length; $V_G$: gate voltage, and $V_T$: threshold voltage.

$I_{on}/I_{off}$ ratio was determined from a ratio of a maximum current in the on-state to a minimum current in the off-state. $I_{on}/I_{off}$ ratio is represented by the following equation:

$$\frac{I_{on}}{I_{off}} = \left(\frac{\mu}{\sigma}\right)\frac{C_o^2}{qN_A t^2}V_D^2$$

wherein $I_{on}$: maximum current, $I_{off}$: off-state leakage current, $\mu$: charge carrier mobility, $\sigma$: conductivity of the thin film, q: electric charge, $N_A$: electric charge density, t: thickness of the semiconductor film, $C_0$: capacitance of the oxide film, and $V_D$: drain voltage.

TABLE 1

| | Charge carrier mobility ($cm^2/Vs$) | $I_{on}/I_{off}$ |
|---|---|---|
| Example 1 | 0.25 | $6.22 \times 10^5$ |
| Example 2 | 0.1 | $4.14 \times 10^4$ |
| Example 3 | 2.5 | $9.22 \times 10^5$ |
| Example 4 | 0.13 | $4.50 \times 10^5$ |
| Example 5 | 0.12 | $2.50 \times 10^5$ |
| Comparative Example 1 | 0.018 | $1.1 \times 10^5$ |
| Comparative Example 2 | 0.005 | $2.01 \times 10^3$ |

As can be seen from the data shown in Table 1, the organic thin film transistors fabricated by the method of the present invention show superior electrical properties, including high charge carrier mobility and high on/off current ratio.

Although the present invention has been described herein with reference to the foregoing specific examples, these examples do not serve to limit the scope of the present invention. Accordingly, those skilled in the art will appreciate that various modifications and changes are possible, without departing from the technical spirit of the present invention.

As apparent from the above description, the method of the present invention enables effective recovery of damaged surface of a gate insulating film by a simple chemical process without the need for an additional material. Therefore, according to the method of the present invention, organic thin film transistors having high charge carrier mobility and high on/off current ratio can be fabricated by a simplified procedure at low cost.

What is claimed is:

1. A method for fabricating an organic thin film transistor comprising a gate electrode, a gate insulating film, source/drain electrodes and an organic semiconductor layer formed in this order on a substrate,
   wherein a surface of the gate insulating film on which source/drain electrodes are formed is impregnated with an inorganic or organic acid, followed by annealing.

2. The method according to claim 1, wherein the inorganic acid is selected from the group consisting of HI, HBr, HCl, HF, $HNO_3$, $H_3PO_4$, $H_2SO_4$, and mixtures thereof.

3. The method according to claim 1, wherein the organic acid is an acid represented by Formula 1 below:

RCOOH     (1)

wherein R is H; a $C_{1\sim12}$ alkyl, alkenyl or alkynyl group; a $C_{3\sim30}$ cycloalkyl group; a $C_{6\sim30}$ aryl group; or a fluoro-substituted functional group.

4. The method according to claim 1, wherein the acid treatment is carried out by impregnating the gate insulating film with an inorganic or organic acid at 15~35° C. for 0.5~10 seconds.

5. The method according to claim 1, wherein the annealing is carried out at 90~200° C. for 1~10 minutes.

6. The method according to claim 1, wherein the gate insulating film is made of a material selected from the group consisting of: organic materials and inorganic materials.

7. The method according to claim 1, wherein the organic semiconductor layer is made of a material selected from the group consisting of pentacenes, copper phthalocyanines, polythiophenes, polyanilines, polyacetylenes, polypyrroles, polyphenylene vinylenes, and derivatives thereof.

8. The method according to claim 1, wherein the gate electrode and the source/drain electrodes are made of a material selected from the group consisting of gold (Au), silver (Ag), aluminum (Al), nickel (Ni), molybdenum (Mo), tungsten (W), indium-tin oxides (ITO), polythiophenes, polyanilines, polyacetylenes, polypyrroles, polyphenylene vinylenes, and polyethylenedioxythiophene (PEDOT)/polystyrenesulfonate (PSS) mixtures.

9. The method according to claim 1, wherein the substrate is made of a material selected from the group consisting of glass, silicon, and plastic.

10. An organic thin film transistor fabricated by the method according to claim 1.

11. A display device comprising an organic thin film transistor fabricated by the method according to claim 1.

12. The method according to claim 1, wherein the gate insulating film is made of a material selected from the group consisting of polyolefins, polyvinyls, polyacryls, polystyrenes, polyurethanes, polyimides, polyvinylphenols and derivatives thereof.

13. The method according to claim 1, wherein the gate insulating film is made of a material selected from the group consisting of $SIN_x$ (0<x<4), $SiO_2$ and $Al_2O_3$.

14. A method for fabricating an organic thin film transistor comprising a gate electrode, a gate insulating film, source/drain electrodes and an organic semiconductor layer formed in this order on a substrate, wherein a surface of the gate insulating film on which source/drain electrodes are formed is impregnated with an inorganic acid, followed by annealing.

15. The method according to claim 14, wherein the inorganic acid is selected from the group consisting of HI, HBr, HCl, HF, $HNO_3$, $H_3PO_4$, $H_2SO_4$, and mixtures thereof.

16. A method for fabricating an organic thin film transistor comprising a gate electrode, a gate insulating film, source/drain electrodes and an organic semiconductor layer formed in this order on a substrate, wherein a surface of the gate insulating film on which source/drain electrodes are formed is impregnated with an organic acid, followed by annealing.

17. The method according to claim 16, wherein the organic acid is an acid represented by Formula 1 below:

RCOOH     (1)

wherein R is H; a $C_{1\sim12}$ alkyl, alkenyl or alkynyl group; a $C_{3\sim30}$ cycloalkyl group; a $C_{6\sim30}$ aryl group; or a fluoro-substituted functional group.

* * * * *